United States Patent
Schellinger et al.

(10) Patent No.: US 7,529,440 B2
(45) Date of Patent: May 5, 2009

(54) CIRCUIT SUBSTRATE SUPPORTING OPTICALLY AND ELECTRICALLY CONVEYED SIGNALS, AND METHOD FOR FORMING SAME

(75) Inventors: Michael W Schellinger, Arlington Heights, IL (US); Rachid M Alameh, Crystal Lake, IL (US); Thomas J. Pack, Boca Raton, FL (US); Louis J. Vannatta, Crystal Lake, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 11/965,313

(22) Filed: Dec. 27, 2007

(65) Prior Publication Data
US 2008/0159688 A1    Jul. 3, 2008

Related U.S. Application Data

(60) Provisional application No. 60/882,981, filed on Dec. 31, 2006.

(51) Int. Cl.
*G02B 6/12* (2006.01)
(52) U.S. Cl. ...................................... 385/14
(58) Field of Classification Search ............ None
See application file for complete search history.

(56) References Cited

U.S. PATENT DOCUMENTS

| | | | | |
|---|---|---|---|---|
| 5,059,475 A | * | 10/1991 | Sun et al. | 428/195.1 |
| 5,237,638 A | | 8/1993 | Narcisco, Jr. | |
| 6,709,607 B2 | | 3/2004 | Hibbs-Brenner et al. | |
| 2005/0220393 A1 | | 10/2005 | Riester et al. | |
| 2006/0018588 A1 | * | 1/2006 | Uchida | 385/14 |
| 2006/0072871 A1 | * | 4/2006 | Uchida | 385/14 |

FOREIGN PATENT DOCUMENTS

JP    2001311846 A    * 11/2001

* cited by examiner

*Primary Examiner*—Michelle R. Connelly-Cushwa
*Assistant Examiner*—Chris Chu
(74) *Attorney, Agent, or Firm*—Lawrence J. Chapa

(57) ABSTRACT

A circuit substrate, which supports optically and electrically conveyed signals, and method for forming the same are provided. The circuit substrate includes a substrate upon which one or more electrically conductive traces are formed, where the electrically conductive traces have areas of isolation between adjacent ones of the electrically conductive traces. The circuit substrate further includes one or more optical waveguides, where the one or more optical waveguides are in the same plane as the one or more electrically conductive traces. The optical waveguides are formed using an optically transmissive material, which is deposited in the areas of isolation between the electrical traces.

20 Claims, 5 Drawing Sheets

CIRCUIT SUBSTRATE SUPPORTING OPTICALLY AND ELECTRICALLY CONVEYED SIGNALS, AND METHOD FOR FORMING SAME

FIELD OF THE INVENTION

The present invention relates generally to a circuit substrate including a plurality of signal paths for supporting the routing of a signal, and more particularly, to a circuit substrate including a plurality of signal paths for supporting both optically and electrically conveyed signals.

BACKGROUND OF THE INVENTION

Slider and clam shell (i.e. folding), as well as other types of devices having multiple housings which move relative to one another, represent a form factor, which has enjoyed a degree of customer acceptance. At least one of the advantages associated with devices having a two part housing, is the ability of the device to be reconfigured dependent upon the current mode of operation. In a device having a slider configuration, the two housing portions will generally shift laterally relative to one another, with the two housing portions typically traveling along respective paths, that are generally parallel to one another. In a device having a clam-shell configuration, the two housing portions will generally rotate relative to one another about a hinged connection. The slider, the clam-shell as well as other multiple housing configurations enable form factors, can generally be more compact when not in use, which can allow the same to be stored more readily, where the two housing portions are allowed to more substantially overlap or nest. Alternatively, when in use, the two housing portions move apart or expand to provide a device with greater surface area to simultaneously support a larger exposed keypad and display, and/or to provide greater length or distance between the microphone and speaker to better bridge the gap defined by the distance between the user's mouth and the user's ear.

However because the components which support processing of signals and/or the supply of power are each often limited to one of the two housing portions, while elements which need to receive power or need to access the processing capabilities of the device are spread across both of the housing portions, the conveyance of power or signals between the two housing portions need to be supported. Power supplying devices, such as batteries, are commonly positioned within a base portion of the device. In the same or other instances, the primary processing element, such as a microprocessor, may be similarly located in one of the two housing portions, such as the base portion, and may need to communicate with elements located in one or both of the two housing portions including instances in which a communication connection with an element in the other housing portion is desired. The base portion also commonly includes the keypad, communication circuitry, and the microphone. The flip or slider portion often includes a display and a speaker, as well as sometimes a camera. It is further envisioned that the flip or slider portion may also increasingly incorporate biometric sensors, such as a fingerprint sensor. In order to support the increasing number of electrical elements, as well as elements having larger size and increasing resolution (i.e. displays and/or cameras) in a multiple housing element device, such as a clamshell or a slider type configuration form factor, communication connections between the multiple housings that support a larger number of signals and/or higher data rates are becoming increasingly important. Both of which are complicated by the need for the signals to be routed through the coupling element, such as a hinge element or a slider mechanism, which couples the multiple housing elements together.

Increases in the amount of data being communicated in an existing number of communication connections will often involve data signals having higher data rates, which can result in a corresponding increase in the amount of electromagnetic energy often characterized as noise and interference, in the case where the electrical signals are conveyed by one or more electrical conductors. In some instances, it may be possible to provide at least some electromagnetic shielding to help alleviate and/or address the production of any unwanted noise or interference. However, in the case where the signals are being routed though a coupling element which supports the relative movement of multiple housing portions, attempting to account for any increases in electromagnetic noise and interference may be problematic, as there can be difficulties associated with providing suitable electromagnetic shielding.

Traditionally, communications between housing portions in at least some instances have been supported using a flexible circuit, which contains one or more signaling paths. Opposite ends of the flexible circuit are generally coupled to respective ones of the two housings, and the length of the flexible circuit is often allowed to include one or more overlapping folds that include one or more bends to selectively create a varying amount of unrealized length, which can accommodate relative movement of the two ends between positions where the two ends are alternatively closer and farther apart as the two housings move relative to one another. In order to accommodate a bend in the flexible circuit, the various layers are sometimes separated. The separation of any shield layers relative to the layers containing signal conveying conductors will often impact the effectiveness of the shield layers proximate the point of any separation. Furthermore the use of a flexible circuit for purposes of conveying electrical signals and the corresponding provision for overlapping folds to account for the movement between housing portions and corresponding communication endpoints, contributes to a requirement for an often meaningful amount of space or volume to accommodate the communication pathways, where space or volume may be at a premium in devices where overall reductions in size are typically strongly desired.

In at least some instance the optical conveyance of one or more signals can sometimes help to alleviate the potential for noise or interference. However, a purely optical solution is not always possible as it is very inefficient to convey power optically. Consequently, the present inventors have recognized that electromagnetic noise and interference, which continues to be present even with the use of differential signaling, can be largely avoided by optically conveying the data signals, as opposed to electrically conveying the same. Further, the inventors have recognized that it is further beneficial to maintain an ability to continue to provide an electrically conductive path for the routing of some signals in addition to the optically conductive paths. As a result, a circuit substrate, which supports both optically and electrically conveyed signals would be beneficial.

SUMMARY OF THE INVENTION

The present invention provides a circuit substrate, which supports optically and electrically conveyed signals. The circuit substrate includes a substrate upon which one or more electrically conductive traces are formed, the electrically conductive traces having areas of isolation between adjacent ones of the electrically conductive traces. The circuit substrate further includes one or more optical waveguides, where the one or more optical waveguides are in the same plane as the one or more electrically conductive traces. The optical waveguides are formed using an optically transmissive material, which is deposited in the areas of isolation between the electrical traces.

In at least one embodiment, the circuit substrate further comprises a coverlay material that is positioned on top of the electrically conductive traces, where the coverlay is located between the electrically conductive trace and an adjacent one of the deposited optical waveguides.

In at least a further embodiment, the circuit substrate further comprises a coverlay material that is positioned on top of the one or more electrically conductive traces and the one or more optical waveguides.

The present invention further provides a method for forming a deposited optical waveguide. The method includes forming one or more electrically conductive traces on a substrate, where adjacent electrically conductive traces have an area of isolation between them. An optically conductive material is deposited in the areas of isolation between the electrically conductive traces within the same plane as the one or more electrically conductive traces between which the optically conductive material is deposited. Any excess optically conductive material that extends beyond the confines of the area of isolation between adjacent ones of the one or more electrically conductive traces is then removed.

These and other features, and advantages of this invention are evident from the following description of one or more preferred embodiments of this invention, with reference to the accompanying drawings.

DETAILED DESCRIPTION OF THE PREFERRED EMBODIMENT(S)

Figure 1:
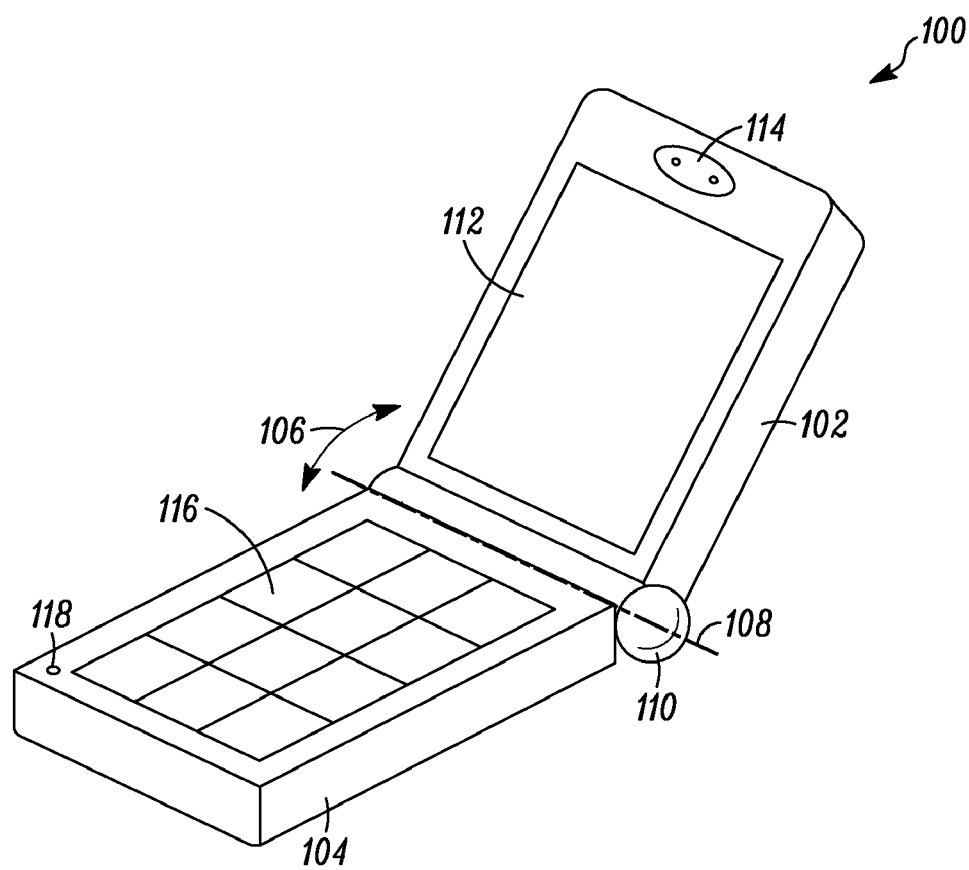
FIG. 1 is an exemplary environment in the form of a wireless communication device having a two part clam shell type housing, within which the present invention can be incorporated.

While the present invention is susceptible of embodiment in various forms, there is shown in the drawings and will hereinafter be described presently preferred embodiments with the understanding that the present disclosure is to be considered an exemplification of the invention and is not intended to limit the invention to the specific embodiments illustrated.

FIG. 1 illustrates an exemplary environment in the form of a wireless communication device 100 having a two part clam shell type housing, within which the present invention can be incorporated. The wireless communication device includes a two part housing including an upper housing 102 or flip portion, and a lower housing 104 or base portion, which each move 106 relative to one another, rotating about an axis 108 at a hinged connection 110. In order to facilitate coupling between the devices situated in the upper housing and the lower housing, in many instances a flexible circuit is routed through the hinged connection.

In the illustrated example, the upper housing 102 includes a display area 112, and one or more speaker ports 114. The lower housing 104 includes a user input section in the form of a keypad 116, as well as a microphone 118. In some instances, at least one of the upper housing 102 and the lower housing 104 may additionally include a camera.

Figure 2:
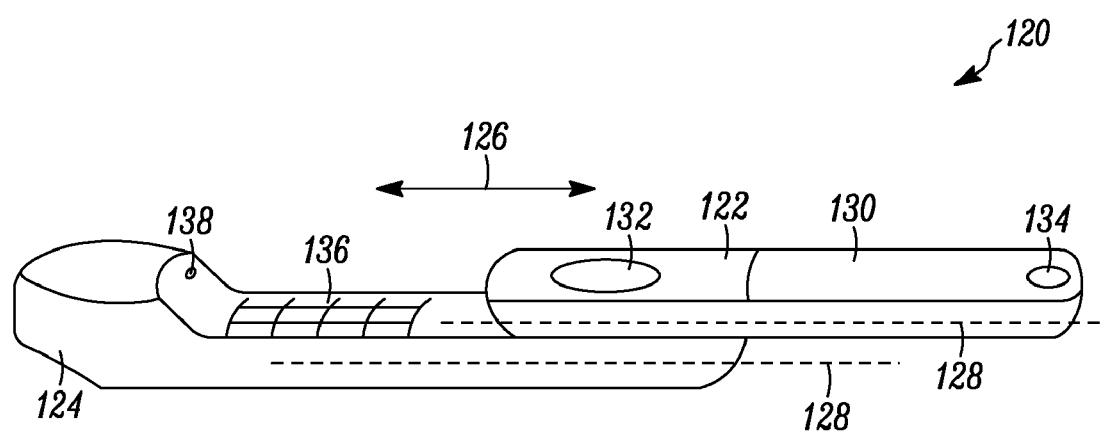
FIG. 2 is a further exemplary environment in the form of a wireless communication device having a two part slider type housing, within which the present invention can similarly be incorporated.

FIG. 2 illustrates an alternative type of exemplary wireless communication device 120 having a two part housing including an upper housing 122 or slider portion, and a lower housing 124 or base portion, which each move 126 relative to one another along a pair of substantially parallel paths 128, where the two part housing corresponds to a slider configuration. The communication device 120, which has a slider configuration, represents a further embodiment in which the present invention can be readily incorporated. Similar to the device having a clam shell type housing, in order to support the relative movement of the multiple housings of a slider type configuration and support the communication between elements located in different housing sections, despite the relative movement of the housings, a flex circuit can similarly be used to facilitate communication between housings.

In the further illustrated example, the upper housing 122 similarly includes a display area 130 and one or more speaker ports 134. The upper housing additionally includes a user input area 132. The user input area can include one or more of a navigational input section for example allowing for the four-way movement of a cursor on the display (i.e. up, down, left and right), and a selection input section for example allowing for the selection of highlighted display elements. In some instances, at least portions of the navigational input section may overlap portions of the selection input section. The lower housing 104 similarly includes a user input section in the form of a keypad 136, as well as a microphone 138. Once again, in some instances, at least one of the upper housing 102 and the lower housing 104 may additionally include a camera.

Generally, in each instance one of the upper housing 102/122 and the lower housing 104/124 will include a power supply, such as a battery, and computing capabilities, such as a microprocessor. However, because both housing parts will often have elements that require one or both of power, data and/or control signals, and some of the elements will not be co-located relative to a particular housing element, with respect to the element that supplies the power, data and/or control signals, signals will commonly need to be conveyed between the upper and lower housings 102 and 104.

As noted previously, a high frequency data signal being conveyed via an electrically conductive connection has a greater propensity to produce unwanted electromagnetic noise and/or interference, whereas the same data signal being conveyed optically does not produce the same effect. Alternatively, an optical communication connection does a relatively poorer job conveying power. However power can be relatively readily conveyed via an electrically conductive connection. Consequently, there would be benefits to being able to mix electrically and optically conductive communication paths via a flexible circuit being routed between the two housings.

Figure 3:
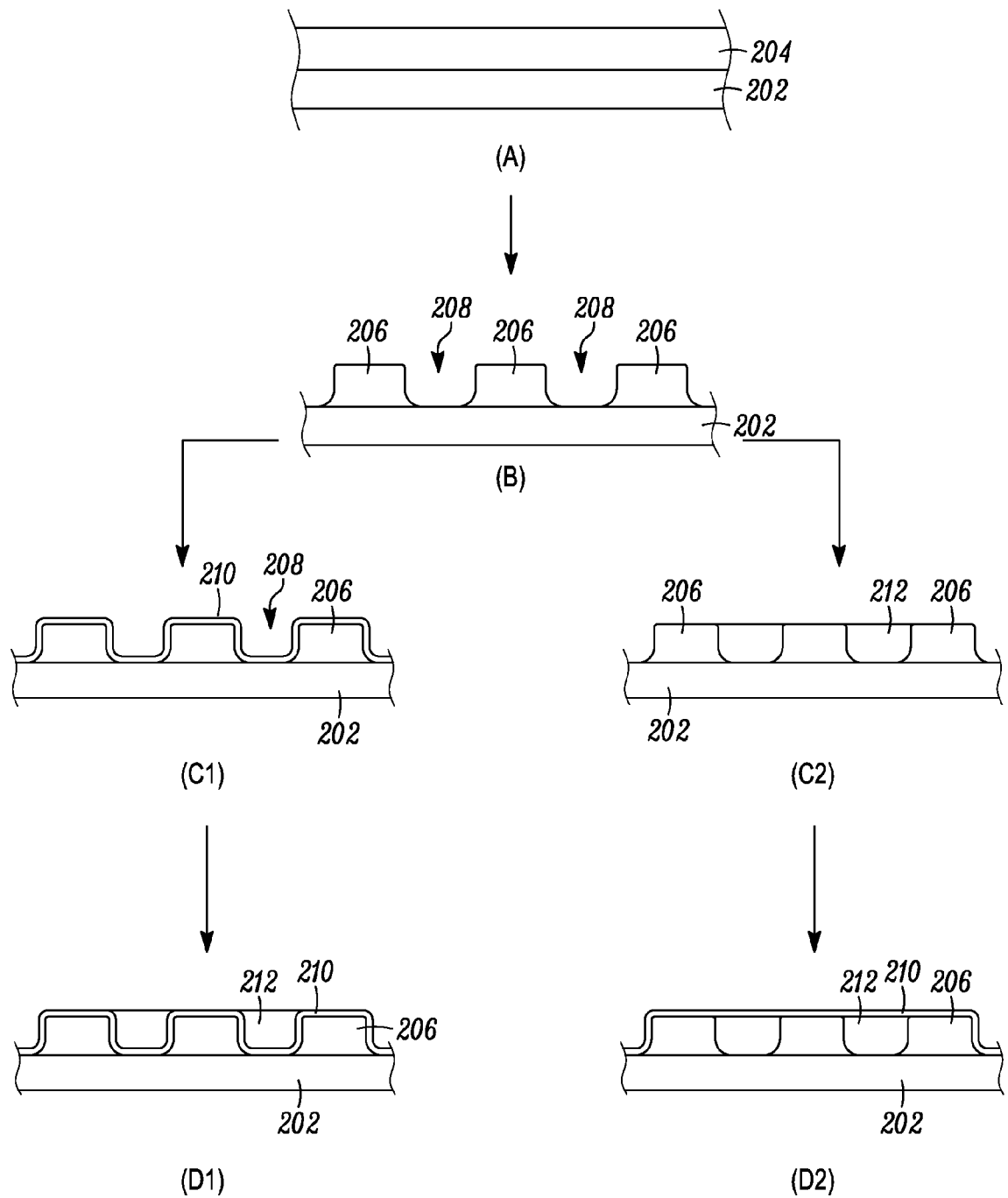
FIG. 3 is a sequence of partial cross sectional side views of a substrate during the formation of optically conductive and electrically conductive signal paths, in accordance with at least a couple of embodiments of the present invention.

FIG. 3 illustrates at least a couple of exemplary sequences of partial cross sectional side views of a substrate during the formation of optically conductive and electrically conductive signal paths, in accordance with at least a couple of embodiments of the present invention. Initially, (A) a substrate 202 with an electrically conductive layer 204 is illustrated. In at least some instances, the electrically conductive layer includes copper or a copper alloy. (B) Portions of the electrically conductive layer 204 is etched away, thereby leaving behind one or more electrically conductive segments 206. As a result of the etching, areas of isolation 208 are formed between adjacent ones of the electrically conductive segments.

In at least some instances, (C1) a coverlay 210 is applied over the one or more electrically conductive segments 206. (D1) An optically conductive material 212 is then deposited into the areas of isolation 208, after which any excess optically conductive material 212 that extends beyond the confines of the area of isolation is removed. In at least some instances, the optically conductive material 212 is silicone, where any excess silicone that is deposited is then wiped away. After wiping away any excess silicone, optically conductive material 212 forming an optically conductive path between the electrically conductive segments 206 and generally in the same plane as the electrically conductive segments 206 is left behind.

In at least some alternative instances, (C2) the optically conductive material 212 is applied, and any excess optically conductive material is removed, before (D2) a coverlay 210 is applied.

Because the conductive traces on a flex circuit often provide a relatively straight path between the end points of the flexible circuit, the areas of isolation between the conductive segments will similarly tend to be able to run continuously along the length of the flex circuit. Such a tendency allows for the very possible inclusion of one or more optically conductive segments in the same plane as the electrically conducive segments.

While the pair of embodiments illustrated in FIG. 3 generally provides for the formation of the electrically conductive segments prior to the deposition of the optically conductive segments, a further possibility involves the deposition of the optically conductive material, before the conductive traces are formed. In such an instance the optically conductive material could be applied directly to the intended portions of the surface of a substrate, and the electrically conductive traces could then be plated onto the exposed portions of the substrate after the optically conductive material is applied. In such an instance, it may be possible to screen the optically conductive material onto the surface of the substrate.

Figure 4:
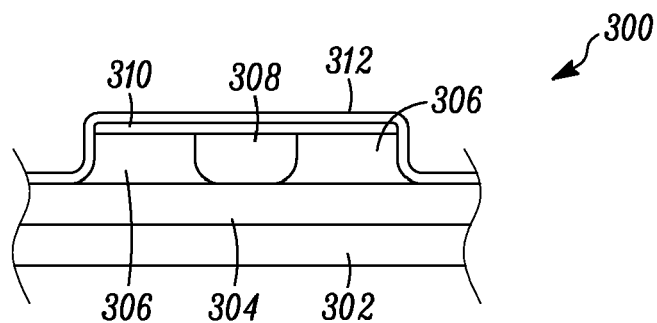
FIG. 4 is a partial cross sectional side view of a substrate including an optically conductive and an electrically conductive signal path, in accordance with at least a further embodiment of the present invention.

FIG. 4 illustrates a partial cross sectional side view 300 of a substrate including an optically conductive and an electrically conductive signal path, in accordance with at least a still further embodiment of the present invention. In the still further embodiment illustrated in FIG. 4, a pair of electrically conductive traces 306 are formed on an electrically conductive layer 304, which has not been etched away from a substrate 302. An optically conductive material 308 is then deposited between the pair of conductive traces 306, after which a further electrically conductive layer 310 is applied across the top of the pair of electrically conductive traces 306 and the optically conductive material 308 prior to the application of a coverlay 312. In this way, the optically conductive material 308 can be substantially encapsulated in an electrically conductive material, which may be better adapted to shield the optically conductive material 308 from stray light which might enter the material from unintended sources, and if the electrically conductive material 304, 306 and 310 is reflective, the shielding may enhance the amount of light that can be effectively conveyed along the length of the optically conductive material 308.

Figure 5:
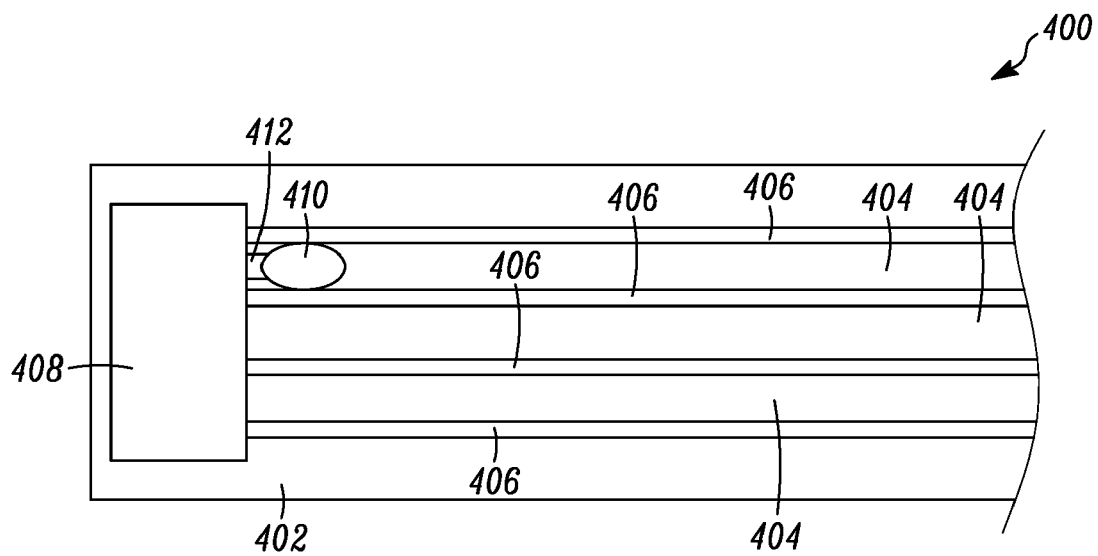
FIG. 5 is a partial top plan view of a substrate including both optically conductive and electrically conductive signal paths, and a manner of making a connection between the optically conductive path and an optical communication device.

FIG. 5 illustrates a partial top plan view 400 of a substrate 402 including both optically conductive signal paths 404 and electrically conductive signal paths 406, and a manner of making a connection between the respective optically conductive path 404 and an optical communication device 408. More specifically, the optical communication connection between the optically conductive path 404 and the optical communication device 408 is facilitated via a drop 410 of the same or similar optically conductive material the optically conductive paths are formed from. In at least some instances silicone might be used. The drop 410 encompasses the optical port 412 of the optical communication device 408 and comes into contact with the optically conductive material forming the intended optically conductive path 404. In some instances, the drop could be of a particular predefined shape, which is intended to enhance the optical coupling into or out of the optical diodes.

In some instances, a particular shape might operate like a lens intended to produce desirable light gathering and/or light directing effects. At least a couple of potential optically coupling enhancing shapes might include conic and/or elongated shapes. The dispersive nature of many types of optically conductive material, such as silicone will often allow enough of the light entering into the drop 410 to disperse into the optically conductive path, or vice versa, to support the conveyance of an optical signal along a reasonable length of an optically conductive path. Generally, at least a portion of the light rays emitted from the LED elements will be received into the optical guides and allow the light to propagate toward the receiving diodes. In instances where the communication path is relatively short, the light path generally need only capture and convey a relatively small percentage of the light rays emitted from the LED elements in order to accurately convey data to the receiving diode at the receiving end of the optically conductive path.

Figure 6:
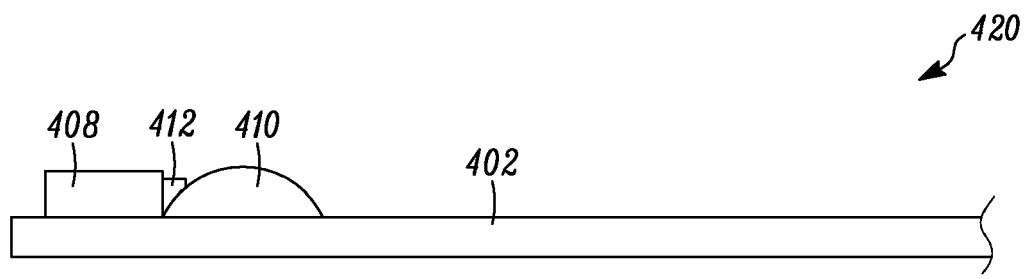
FIG. 6 is a partial side plan view of the substrate illustrated in FIG. 5.

FIG. 6 illustrates a partial side plan view 420 of the substrate 402 illustrated in FIG. 5, wherein the drop 410 of optically conductive material can be seen extending above the substrate 402 to encapsulate the optical port 412 of the optical communication device 408. While the illustrated embodiment show the drop 410 extending above and encapsulating the optical port 412 of the optical communication device 408, in some instance the drop need not encapsulate the optical port 412 for purposes of producing a sufficient optical coupling. In other words, an air gap could exist between the drop 410 and the optical port 412, and still produce the desired coupling. Still further, instead of a drop 410, it may be possible to use a preformed shape, which could be coupled to the optically conductive path 404 or inserted into a preformed and/or machined cutout formed into the optically conductive path 404. In such an instance, the preformed shape might extend partially into the optically conductive path 404, via a cutout, and extend partially above the path to provide the desired alignment with the optical port 412 or the optical communication device 408.

Figure 7:
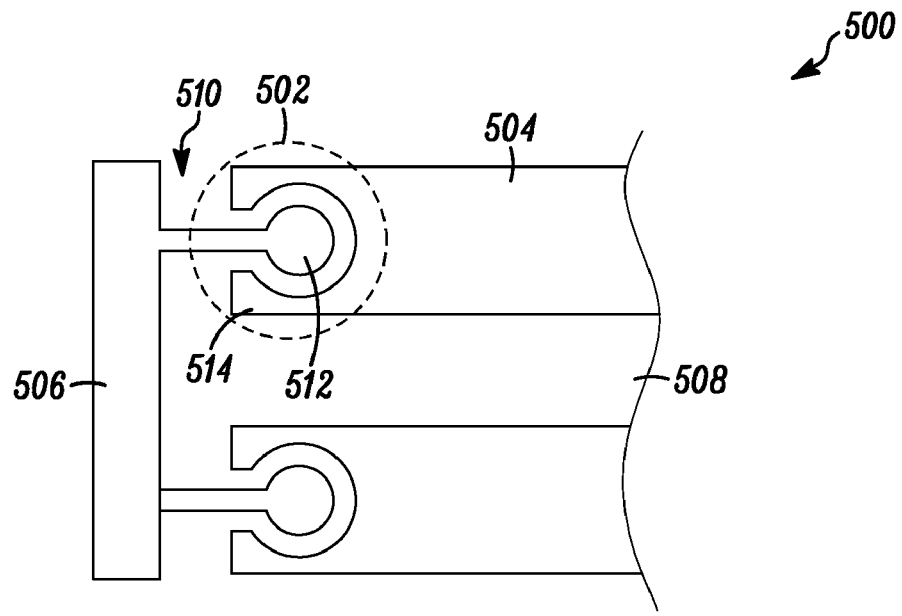
FIG. 7 is a partial top plan view of an optical signal choke.

As noted above, in many instances conductive traces that are fairly uniform and traverse the length of a flexible circuit are fairly common. However, in some instances, it may be undesirable for the electrically conductive trace to run the full length of the desired distance of the optically conductive path. In such an instance it may be possible to piece together two or more distinct (i.e. electrically isolated) electrically conductive paths, which travel along the full length of the intended path of the optical path, and provide an effective optical barrier for light traveling within the optical path along the length. In at least some instances, such a barrier can continue to provide optical isolation between other nearby optical communication paths. FIG. 7 illustrates a partial top plan view 500 of an optical signal choke 502, which can be used at a junction of two separate conductive paths 504 and 506, and which together with the optical signal choke 502 can be used to form an effective optical barrier along a junction between two or more discontinuous electrically conductive trace, and an optical communication path 508. In this way, an optically conductive material can still generally be applied between the spaces formed between the electrically conductive material with reduced fears of optical cross talk between adjacent optical communication paths 508 and 510, despite the fact that the barrier between the two is not continuous.

More specifically the optical choke 502 includes nested electrically conductive structures 512 and 514, which while remaining electrically isolated provide for a circuitous path having relatively tight turns that make propagation of the light through the resulting optical path very difficult, such that any light that is able to traverse the path will be sufficiently attenuated to be largely inconsequential.

Figure 8:
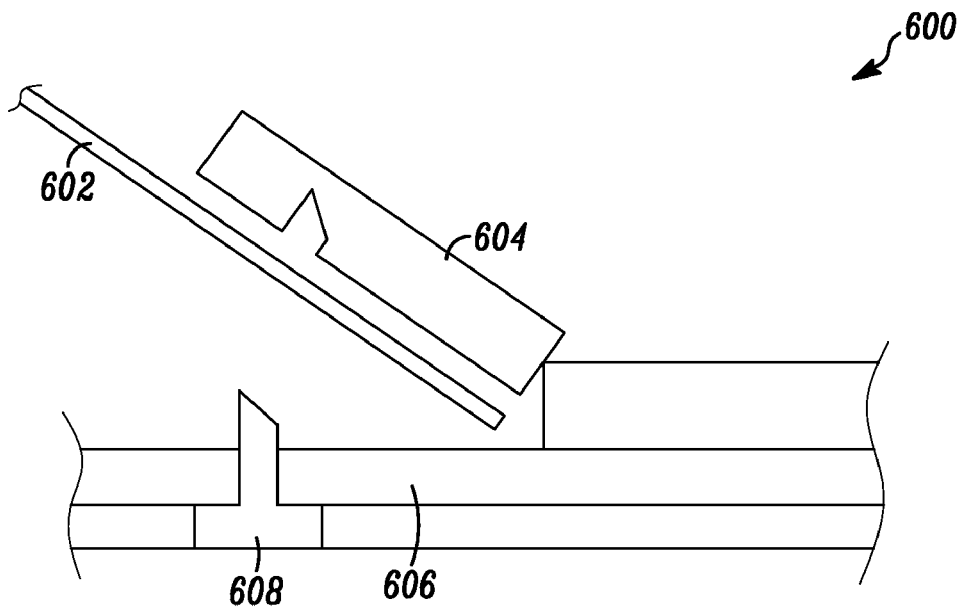
FIG. 8 is a partial side plan view of a connector for establishing an electrical and/or an optical connection with a substrate having both optically conductive and electrically conductive signal paths

FIG. 8 illustrates a partial side plan view of a further connector 600, which is potentially compatible with both establishing an electrical and/or an optical connection with a substrate 602 having both optically conductive and electrically conductive signal paths. More specifically, the connector 600 has two parts, an upper portion 604 that is hinged relative to a lower portion 606, which when mated with one another, provides for one or more sharp segments 608 that can pierce a captivated substrate 602, at different points across the width of the substrate. In some instances, the sharp segments may be comprised of an electrically conductive material, which when it pierces the substrate 602, the sharp segment comprised of the electrically conductive material is intended to make a connection with an electrically conductive trace, which is aligned with the corresponding sharp segment. In other instances, the sharp segments 608 may be comprised of an optically conductive material, which is similarly intended to pierce the substrate 602. When the sharp segment 608 comprised of an optically conductive material pierces the substrate, instead of coupling to an electrically conductive trace, the sharp segment 608 can be optically coupled to a correspondingly aligned optically conductive communication paths. By making use of alternative ones of electrically conductive sharp segments, and optically conductive sharp segments 608, and positioning them accordingly, a coupling between the substrate and the connector and correspondingly any element coupled to the other end of the connector 600 can be established. In some instances instead of piercing the substrate, an interaction which brings the elements into close proximity and/or contact with one another might be sufficient to produce the desired coupling.

As an example of further embodiments, the electrical couplings might be established through alternative non-substrate piercing coupling techniques including making an electrical connection through a connector, such as a ZIF connector. Nevertheless, the use of a non-substrate piercing coupling technique for establishing an electrical connection does not preclude the use of a substrate piercing technique of the type described above still being used for establishing optical connection(s) with at least some of the optically conductive path(s).

Figure 9:
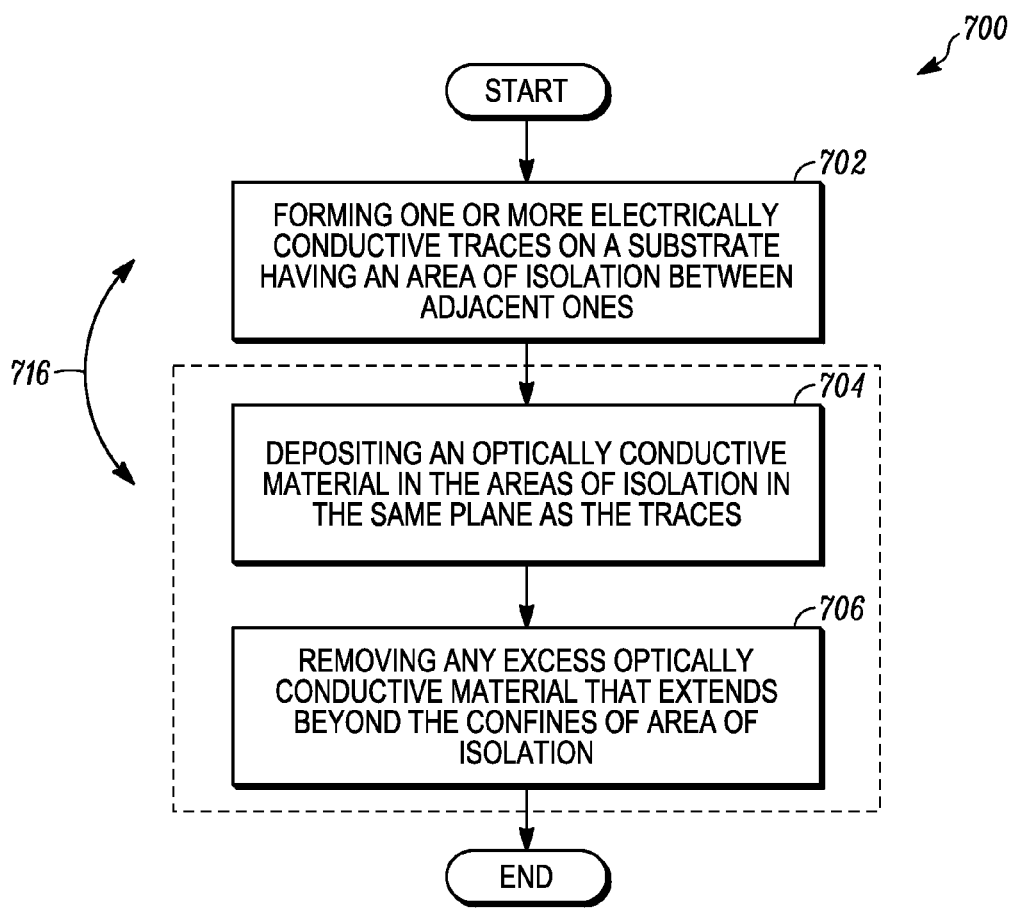
FIG. 9 is a flow diagram of a method for forming a deposited optical waveguide, in accordance with at least some embodiments of the present invention.

In conjunction with the above noted and described circuit substrate, which supports optically and electrically conveyed signals, FIG. 9 illustrates a flow diagram 700 of a method for forming a deposited optical waveguide, as part of forming such a circuit substrate, in accordance with at least some embodiments of the present invention. The method includes forming 702 one or more electrically conductive traces on a substrate having an area of isolation between adjacent one of the electrically conductive traces. An optically conductive material is then deposited 704 in the areas of isolation in the same general plane as the electrically conductive traces. Any excess optically conductive material is then removed 706, which extends beyond the confines of the area of isolation.

Figure 10:
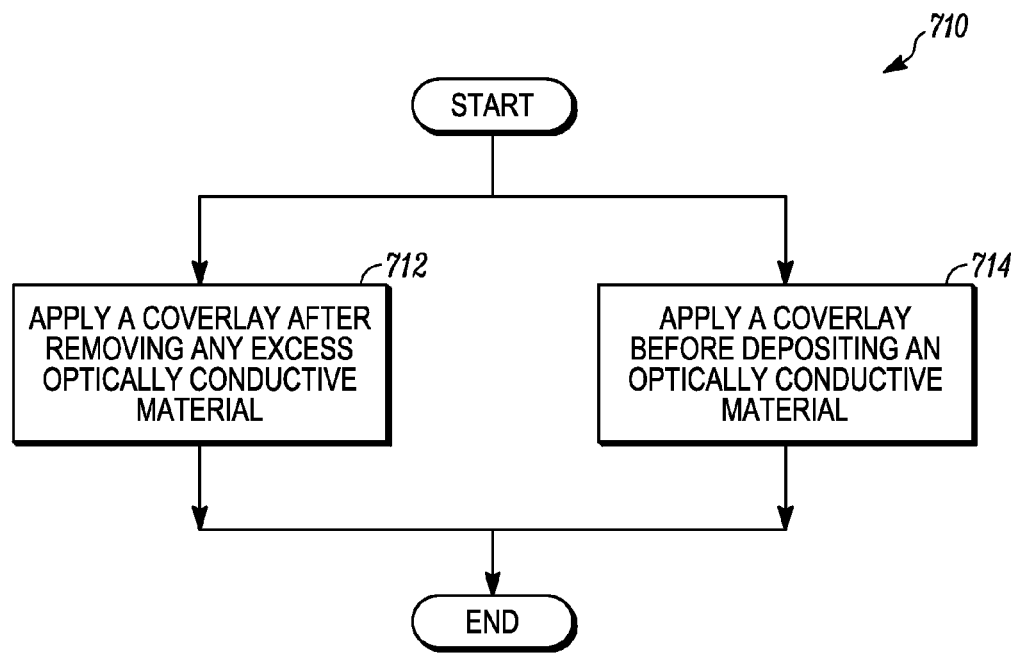
FIG. 10 is a flow diagram of a method for applying a coverlay as part of forming a deposited optical waveguide, as illustrated in FIG. 9.

FIG. 10 illustrates still further features of a flow diagram of a method for forming a deposited optical waveguide including the feature of applying 710 a coverlay as part of forming 700 a deposited optical waveguide, as illustrated in FIG. 9. In some instances the coverlay will be applied 712 after any excess optically conductive material is removed 706, while in other instances the coverlay will be applied 714 before depositing 704 an optically conductive material.

As noted previously, in some instances the specific order in which the electrically conductive traces are formed and the optically conductive material is deposited can be reversed 716, without departing from the teachings of the present invention.

While the preferred embodiments of the invention have been illustrated and described, it is to be understood that the invention is not so limited. Numerous modifications, changes, variations, substitutions and equivalents will occur to those skilled in the art without departing from the spirit and scope of the present invention as defined by the appended claims.

What is claimed is:

1. A circuit substrate supporting optically and electrically conveyed signals comprising:
    a substrate upon which one or more electrically conductive traces are formed having areas of isolation between adjacent ones of the electrically conductive traces;
    one or more optical waveguides, wherein the one or more optical waveguides are in the same plane as the one or more electrically conductive traces and are formed using an optically transmissive material deposited in the areas of isolation between the electrical traces; and
    one or more optical chokes, each optical choke associated with an end of one of the one or more electrically conductive traces.

2. A circuit substrate supporting optically and electrically conveyed signals in accordance with claim 1, wherein the substrate is flexible.

3. A circuit substrate supporting optically and electrically conveyed signals in accordance with claim 1, wherein the sides of the optically transmissive material follow the contour of the adjacent electrically conductive trace.

4. A circuit substrate supporting optically and electrically conveyed signals in accordance with claim 1, further comprising a coverlay material positioned on top of the one or more electrically conductive traces and the one or more optical waveguides.

5. A circuit substrate supporting optically and electrically conveyed signals in accordance with claim 1, wherein the optical waveguides are in direct contact with the corresponding adjacent electrically conductive trace.

6. A circuit substrate supporting optically and electrically conveyed signals in accordance with claim 1, wherein the one or more optical chokes, each, include a substantially curved path which changes direction at least once.

7. A circuit substrate supporting optically and electrically conveyed signals in accordance with claim 1, wherein the height of the deposited optically transmissive material is adjusted so as to be substantially the same or less than the height of the corresponding adjacent electrically conductive trace along the length of optical waveguide away from the connection points where an optical transmitter or optical receiver is coupled to the optical waveguide.

8. A circuit substrate supporting optically and electrically conveyed signals in accordance with claim 1, wherein the one or more electrically conductive traces are plated with or formed from an optically reflective material.

9. A circuit substrate supporting optically and electrically conveyed signals in accordance with claim 1, wherein the optically transmissive material is silicone.

10. A circuit substrate supporting optically and electrically conveyed signals in accordance with claim 1, wherein the optically transmissive material is not electrically conductive.

11. A circuit substrate supporting optically and electrically conveyed signals comprising:
    a substrate upon which one or more electrically conductive traces are formed having areas of isolation between adjacent ones of the electrically conductive traces;
    one or more optical waveguides, wherein the one or more optical waveguides are in the same plane as the one or more electrically conductive traces and are formed using an optically transmissive material deposited in the areas of isolation between the electrical traces; and
    a coverlay material positioned on top of the electrically conductive traces, where the coverlay is located between the electrically conductive trace and an adjacent one of the deposited optical waveguides.

12. A circuit substrate supporting optically and electrically conveyed signals in accordance with claim 11, wherein the coverlay is formed on top of the electrically conductive traces prior to the deposition of the optically transmissive material forming the one or more optical waveguides.

13. A circuit substrate supporting optically and electrically conveyed signals in accordance with claim 11, wherein the substrate is flexible.

14. A circuit substrate supporting optically and electrically conveyed signals comprising:
    a substrate upon which one or more electrically conductive traces are formed having areas of isolation between adjacent ones of the electrically conductive traces; and
    one or more optical waveguides, wherein the one or more optical waveguides are in the same plane as the one or more electrically conductive traces and are formed using an optically transmissive material deposited in the areas of isolation between the electrical traces; and
    wherein the substrate includes an electrically conductive layer upon which the electrically conductive traces and the one or more optical waveguides are formed.

15. A circuit substrate supporting optically and electrically conveyed signals in accordance with claim 14, wherein an electrically conductive top layer is deposited on top of and across the one or more electrically conductive traces and the one or more optical waveguides prior to the positioning of a coverlay over the conductive top layer, the one or more electrically conductive traces, the one or more optical waveguides, and the substrate.

16. A circuit substrate supporting optically and electrically conveyed signals in accordance with claim 14, wherein the substrate is flexible.

17. A method for forming a deposited optical waveguide, the method comprising:
    forming one or more electrically conductive traces on a substrate having an area of isolation between adjacent electrically conductive traces;
    applying a coverlay before depositing an optically conductive material in areas of isolation between the electrically conductive traces;
    depositing an optically conductive material in areas of isolation between the electrically conductive traces within the same plane as the one or more electrically conductive traces between which the optically conductive material is deposited; and
    removing any excess optically conductive material that extends beyond the confines of the area of isolation between adjacent ones of the one or more electrically conductive traces.

18. A method in accordance with claim 17, wherein the substrate is formed from a flexible material.

19. A method for forming a deposited optical waveguide, the method comprising:
    forming one or more electrically conductive traces on a substrate having an area of isolation between adjacent electrically conductive traces;
    depositing an optically conductive material in areas of isolation between the electrically conductive traces within the same plane as the one or more electrically conductive traces between which the optically conductive material is deposited; and
    removing any excess optically conductive material that extends beyond the confines of the area of isolation between adjacent ones of the one or more electrically conductive traces; and
    wherein the substrate includes a conductive layer upon which the one or more electrically conductive traces are formed, and wherein the method further comprises:
    depositing an electrically conductive top layer over the formed one or more electrically conductive traces and the deposited optically conductive material after the excess optically conductive material has been removed, and
    applying a coverlay over the electrically conductive top layer, the one or more electrically conductive traces, and the deposited optically conductive material.

20. A method in accordance with claim 19, wherein the substrate is formed from a flexible material.

* * * * *